United States Patent [19]

Cain et al.

[11] Patent Number: 5,336,366
[45] Date of Patent: Aug. 9, 1994

[54] NEW DRY ETCH TECHNIQUE

[75] Inventors: John L. Cain, Schertz; Chang-Ou Lee, San Antonio, both of Tex.

[73] Assignee: VLSI Technology, Inc., San Jose, Calif.

[21] Appl. No.: 42,929

[22] Filed: Apr. 5, 1993

[51] Int. Cl.$^5$ .................... H01L 21/306; B44C 1/22
[52] U.S. Cl. .................... 156/643; 156/345
[58] Field of Search ............ 156/643, 646, 345; 204/164, 192.32, 298.33, 298.35

[56] References Cited

U.S. PATENT DOCUMENTS

| | | | |
|---|---|---|---|
| 4,065,369 | 12/1977 | Ogawa et al. | 204/164 |
| 4,123,316 | 10/1978 | Tsuchimoto | 156/643 |
| 4,192,706 | 3/1980 | Horiike | 156/643 |
| 4,559,099 | 12/1985 | Liebel et al. | 156/345 |

OTHER PUBLICATIONS

"Dry Etching for VLSI Fabrication", by S. Wolf and R. N. Tauber, *Silicon Processing for the VLSI Era, vol. 1: Process Technology*, Lattice Press, pp. 539–585 (1986).

"A New Chemical Dry Etching", by Yasuhiro Horiike and Masahiro Shibagaki, *Proceedings of the 7th Conference on Solid State Devices, Tokyo, 1975, Supplement to Japanese Journal of Applied Physics*, vol. 15, pp. 13–18 (1976).

"Chemiluminescence and the Reaction of Molecular Fluorine with Silicon", by J. A. Mucha, V. M. Donnelly, D. L. Flamm, and L. M. Webb, *J. Phys. Chem.*, 1901, B5, pp. 3529–3532 (1981).

"A Dry Etching Technology Using Long-Live Active Species Excited by Microwave", by Y. Horiike and M. Shibagaki, Toshiba Research and Development Center, Tokyo Shibaura Electric Co., Ltd., Kawasaki, Japan, pp. 1–11.

"Down-Flow Type Resist Ashing Technique Employing Reaction of Fluorine Atoms to Water Vapor", by H. Okano, N. Hayasaka and Y. Horiike, VLSI Research Center Toshiba Corp.

"Radio-Frequency (RF) Sputtering", by S. Wolf and R. N. Tauber, *Silicon Processing for the VLSI Era, vol. 1: Process Technology*, Lattice Press, pp. 348–353 (1986).

"High Vacuum Pumps III: Turbomolecular Pumps", by S. Wolf and R. N. Tauber, *Silicon Processing for the VLSI Era, vol. 1: Process Technology*, Lattice Press, pp. 95–97 (1986).

*Primary Examiner*—William Powell
*Attorney, Agent, or Firm*—Majestic, Parsons, Siebert & Hsue

[57] ABSTRACT

A dry etcher and method using two chambers can be used for anisotropic or isotropic etching. A pressure differential is created between the first and second chambers using a passage between the first and second chambers. Additionally, baffles which remove some of the ions created in the first chamber are used.

21 Claims, 3 Drawing Sheets

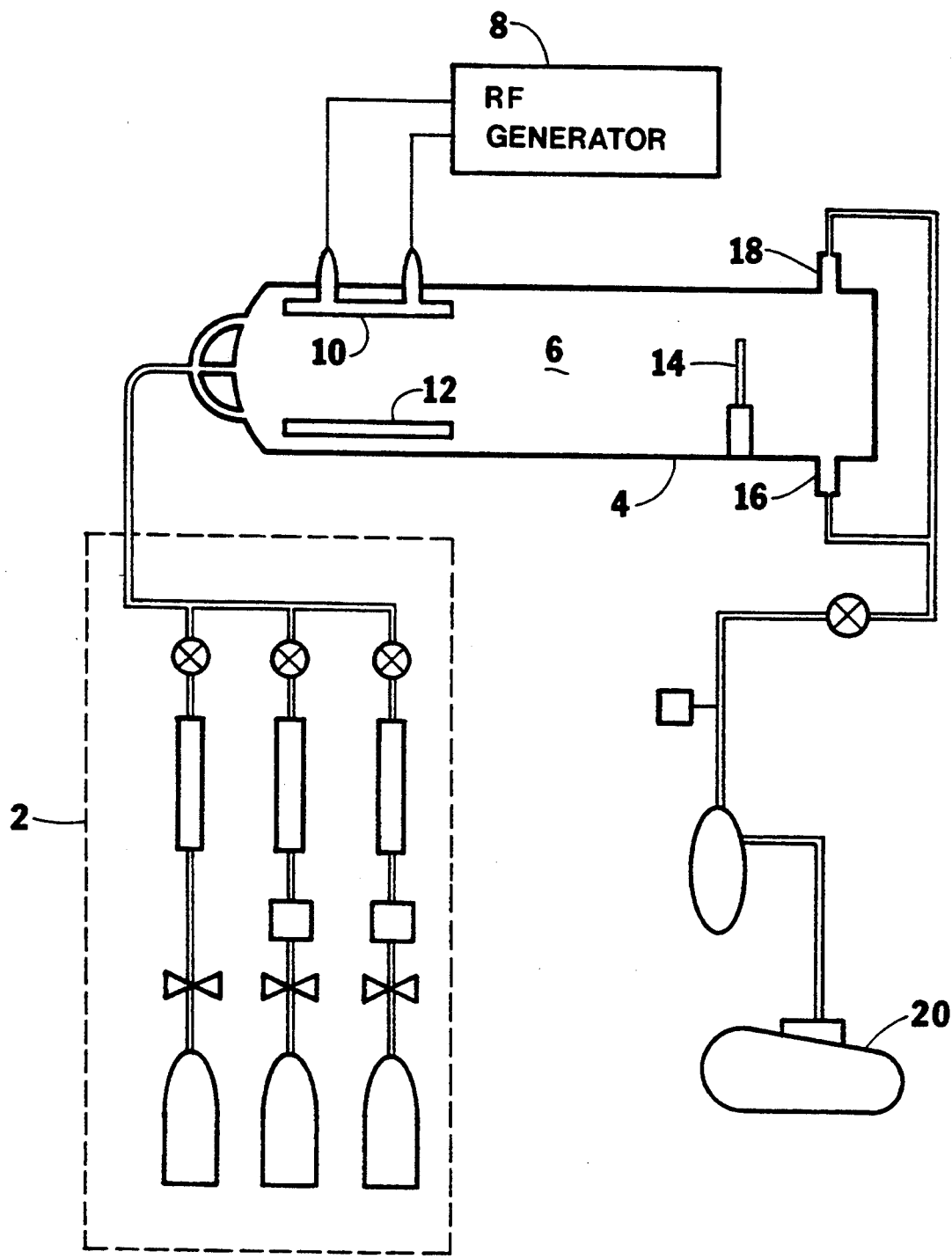
FIG._1.
(PRIOR ART)

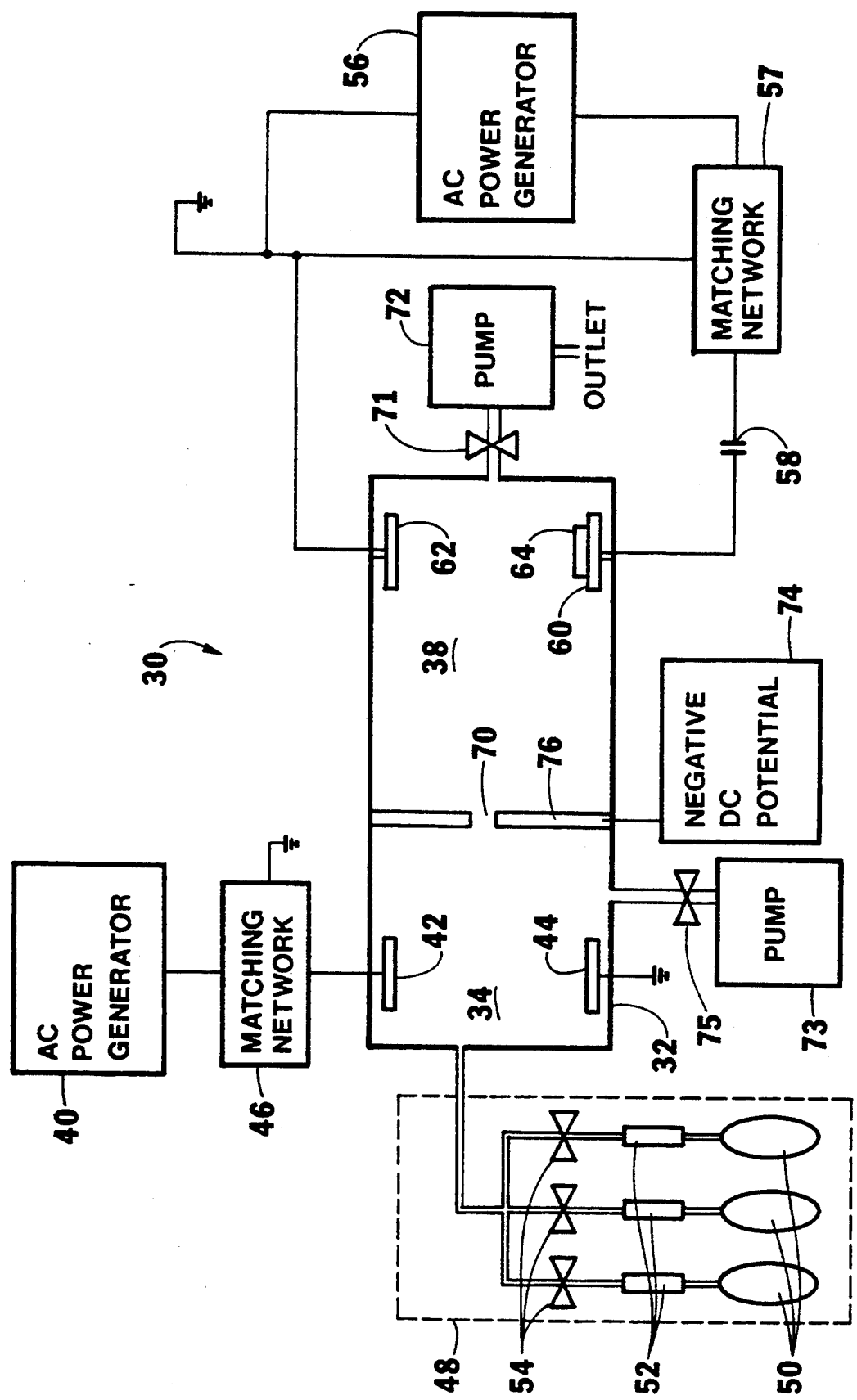
FIG._2.

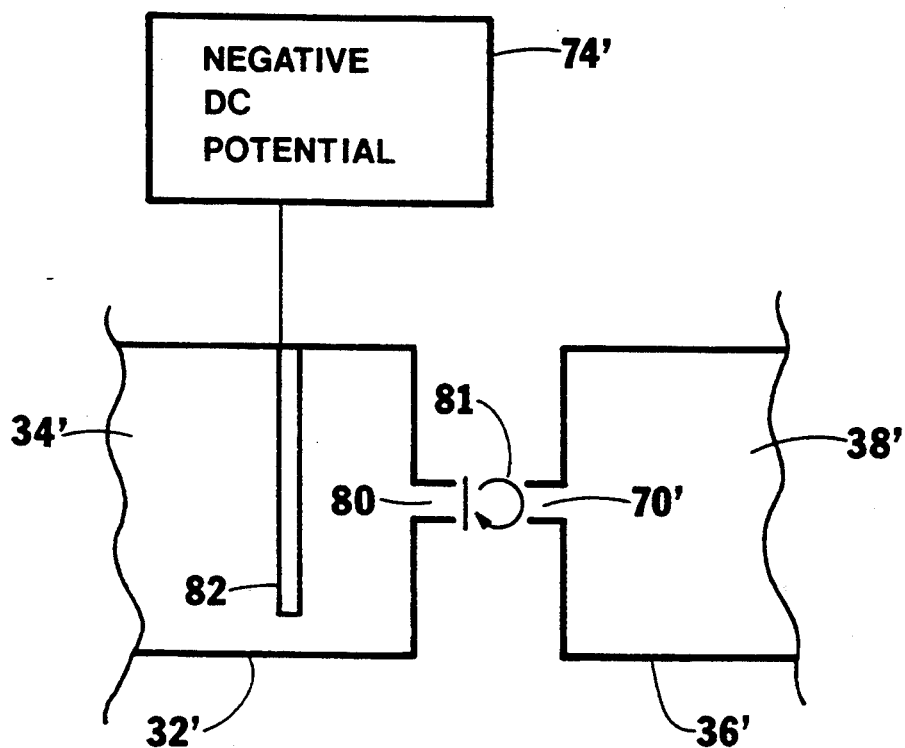
FIG._3.

NEW DRY ETCH TECHNIQUE

BACKGROUND OF THE INVENTION

This invention relates to dry etchers for etching layers on a semiconductor wafer. Dry etching offers the important manufacturing advantage of eliminating the handling, consumption, and disposal of the relatively large quantities of dangerous acids and solvents used in wet etching processes.

Popular dry etch techniques include plasma etching and Reactive ion etching (RIE). These techniques are standard etching techniques used in the industry for anisotropic etching. In the RIE mode, the wafers are placed directly upon an electrode connected to a radio frequency (RF) power generator. Neutral chemical reactive species and ions are formed in a plasma discharge between the electrodes. These ions energetically bombard the wafer to help cause a directional etch.

In plasma etching, the wafer is placed on an electrode which is connected to the ground. The radio frequency power source produces chemically reactive species and ions. Since an electrical potential difference exists between the plasma and the grounded electrode on which the wafers are placed, the ions are still attracted to the wafers. Thus, even in plasma etch mode, wafers are subject to energetic ionic bombardment although usually to a much lesser degree than in the RIE mode.

In both RIE and in plasma etch modes the bombarding ions and the chemically reactive species can form an anisotropic or directional etch onto the wafers. In anisotropic etching, ions bombard the layer to be etched and the chemically reactive species aid in the etching.

In reactive ion etching, various forms of radiation damage can be formed on the materials being etched because of the energetic bombardment of ions. This radiation damage can include electron traps in the gate oxides, which if not annealed out, can cause shifts in the threshold voltages of metal-oxide-silicon (MOS) devices; displaced atoms and implanted atoms in the surface due to ion bombardment; and under some etching conditions, the destruction of the gate oxide.

An etching technique typically used for isotropic etching is downstream etching. Isotropic etches etch the wafer in all directions at substantially the same rate and therefore isotropic etches are not directional.

Downstream etching is discussed in "A New Chemical Dry Etching" Y. Horiike and M. Shibagaki, Proceedings of the 7th Conference on Solid State Devices, Tokyo, 1975. FIG. 1 is a schematic diagram of a prior art radio frequency (RF) downstream etcher. A gas supply 2 provides gases to a container 4 defining a chamber 6. A radio frequency generator 8 is connected to electrodes 10 and 12. The electric signal between the electrodes 10 and 12 through the gases in the chamber 6 produces a plasma discharge that forms chemically reactive species and ions. Since the wafer 14 is some distance from the electrodes 10 and 12, the wafer will not suffer radiation damage. The chemically reactive species and ions created in the plasma discharge between electrodes 10 and 12 flow towards the wafer 14. Due to the distance of the wafer from the electrodes, the ions will recombine before reaching the wafer. Since the chemically reactive species are longer lasting, the etching at the wafer 14 is caused by the chemically reactive species. The gases in the chamber 6 are removed by ports 16 and 18 connected to a pump 20.

Downstream etching avoids the radiation damage to the wafer which is often found in reactive ion etching. The downstream etcher, however, cannot produce a truly anisotropic profile due to the lack of directional ion bombardment.

SUMMARY OF THE INVENTION

Many of the advantages of the present invention stem from the use of two chambers in the etcher. Chemically reactive species can be formed in the first chamber using a first alternating current (AC) power generator set at a relatively high power. A second AC power generator in the second chamber set at a lower power can produce a directional etch by creating ions. This second AC power generator can be set at a lower power than that used in other anisotropic etchers so that the radiation damage on the wafers is reduced. Optionally, the second AC power generator can also be turned off so that the wafer is etched isotropicly.

Additionally, a passage with selected cross-sectional dimensions between the chambers can maintain different gas pressures in the first and second chambers while permitting the transfer of chemically reactive species. The chemically reactive species produced in the first chamber are transferred into the second chamber to aid in the etching of a wafer. In this way, the first AC power generator can operate in the gas pressure region between 200 and 400 mTorr and the second chamber can operate in the gas pressure region below ten mTorr. Gas pressures of below 10 mTorr are required for accurate anisotropic etching. A further aspect of the invention concerns the use of baffles to remove ions from the gas in the first chamber before it is transferred to a second chamber.

The present invention uses an etching device for etching a layer on a substrate. This etching device comprises a first container defining a first chamber. The first container includes a means for supplying gases, and a first AC power means for supplying an AC signal to the gases to form chemically reactive species. The etching device also comprises a second container defining a second chamber. The first and second containers define a passage connecting the first and second chambers. This passage is adapted to transfer some of the chemically reactive species from the first chamber to the second chamber. The passage is further adapted to maintain different gas pressures in the first and second chambers. The second container includes a second AC power means for forming ions and for setting a variable Direct Current (DC) offset on the substrate.

Furthermore, the present invention alternatively comprises using a etching device for etching a layer on a substrate. The etching device comprises a first container defining a first chamber. The first container includes a means for supplying gases and a first AC power means for supplying an AC signal to the gases to form chemically reactive species and to form ions. The first chamber further comprises a baffle for reducing the amount of ions that are transferred into the second chamber. The etching device further comprises a second container defining a second chamber. The second chamber is connected to the first chamber. The second chamber includes a second AC power means for forming ions and for setting a variable DC offset on the substrate.

Additionally, the present invention comprises a method of etching a layer on a substrate in a etching device including a first container defining a first chamber and a second container defining a second chamber. The method comprises the steps of introducing gases into the first chamber; forming chemically reactive species in the first chamber from the gases using a plasma discharge; transferring gases including some of the chemically reactive species from the first chamber to the second chamber; maintaining different gas pressures in the first and second chambers; and etching the layer on the substrate in the second container with the transferred gas.

In addition, present invention alternatively comprises using a method of etching a layer on a substrate in a etching device including a first container defining a first chamber and a second container defining a second chamber. The method comprises the steps of introducing gases into the first chamber; forming chemically reactive species and ions in the first chamber from the gases using a plasma discharge; removing some of the ions from the gases by electrically attracting the ions to a baffle; thereafter, transferring the gases including some of the chemically reactive species from the first chamber to the second chamber; maintaining different gas pressures in the first and second chambers; and etching the layer on the substrate in a second container with the transferred gas.

BRIEF DESCRIPTION OF THE DRAWINGS

The above and other features and aspects of the present invention will become more apparent upon reading the following detailed description in conjunction with the accompanying drawings, in which: FIG. 1 is a schematic diagram of a prior art radio frequency downstream etcher. FIG. 2 is a schematic diagram of a dry etcher of the present invention. FIG. 3 is a partial schematic diagram of an alternative embodiment of the dry etcher of the present invention showing a tube connecting the first and second chambers.

DETAILED DESCRIPTION OF THE PREFERRED EMBODIMENT

FIG. 2 is a schematic diagram of a dry etcher 30 of the present invention. The dry etcher 30 comprises a first container 32 defining a chamber 34 and a second container 36 defining a chamber 38. The first and second containers 32 and 36 can be integral to each other forming parts of a single large container as shown in FIG. 2 or, as shown in FIG. 3, the containers 32' and 36' can be separate. Looking at FIG. 2, connected to the first container 32 is an alternating current power generator 40. This alternating current power generator 40 supplies power to electrodes 42 and 44. This power generator 40 could be set up to generate a signal in the radio frequency range, i.e. 13.56 MHz, the microwave range, i.e. 2.45 GHz, or in the low frequency range, i.e. 100 KHz. The AC power generator 40 and electrodes 42 and 44 create a plasma discharge which forms chemically reactive species and ions. The AC power generator 40 is operated at sufficient discharge powers of around 2000 watts to create a large amount of the neutral chemically reactive species, a plasma with a very large ion density and energy, and a very large plasma potential and induced DC bias. In an anisotropic etch of a wafer in the second chamber, the large amount of chemically reactive species produced in the first chamber 34 allows for the use of a less powerful, thus less damaging, plasma discharge in the second chamber 38.

The matching network 46 is used to prevent power from reflecting from the chamber 34 and burning out the AC power generator 40.

The gas supply 48 provides the gases from which the chemically reactive species and ions are formed. This gas supply 48 typically consists of gas tanks 50, flow meters 52 for measuring the flow of the gases and valves 54. Typical etching gases used for various integrated circuit materials are shown in a table in S. Wolf and R. N. Tauber, *Silicon Processing For The VLSI Era, Vol. 1: Process Technology*, Lattice Press (1986), on page 581.

The second AC power generator 56 is connected to a blocking capacitor 58 and to electrodes 60 and 62. The blocking capacitor 58 is used to set a DC bias on electrode 60. The wafer 64 is placed on top of electrode 60. When second AC power generator 56 is turned on, the AC power generator 56 produces a plasma discharge between electrodes 60 and 62. The frequency of the second AC power generator is preferably set in the low frequency range at 100 kHz or in the radio frequency range at 13.56 MHz. The second AC power generator 56 is preferably used at discharge powers of 500 watts or less so that enough ions are created to create a directional bombardment of the wafer surface without causing substantial radiation damage to the wafer surface. Power levels of 100 watts or less can be used in the second chamber 38 when sufficient chemically reactive species are generated in the first chamber 34.

The dry etcher 30 can be used in isotropic or anisotropic etch modes. When the second AC power generator 56 is turned off the wafer 64 is etched isotropicly and when the second AC power generator 56 is turned on the ions formed in the second chamber 38 assist in an anisotropic etch of the wafer 64. In effect, the dry etcher 30 can act as a "direct" or "downstream" etcher.

The matching network 57 prevents a mismatch with the chamber 38 such that the reflected power might burn out the second AC power generator 56.

A passage 70 connects between the first chamber 34 and the second chamber 38. This passage 70 is used to transport the chemically reactive species formed in the first plasma discharge between electrodes 44 and 42 to the second chamber 38 to aid in the etching of the wafer 64. Additionally, this passage 70 can create a pressure differential between the first chamber 34 and the second chamber 38. The benefit of such a pressure differential is that the first plasma discharge between electrodes 42 and 44 in the first chamber 34 can be formed at a relatively higher gas pressure than the gas pressure in the second chamber 38.

The plasma discharge in the first chamber 34 used to produce the large number of chemically reactive species proceeds better at a relatively higher gas pressure than the gas pressure used in the second or etching chamber 38. Generally, the produced ion density increases as the pressure is increased. For a more accurate anisotropic etch, gas pressures of below 10 mTorr are required in the second chamber 38. The passage 70 is designed so that the pressure in the second chamber 38 is low enough for a highly accurate anisotropic etch and so that the pressure in the first chamber 34 is relatively high. In the preferred embodiment, the passage 70 is between ½" to 1" in diameter to help facilitate the pressure differential. A relatively high gas pressure in the first chamber 34 allows for a large amount of neutral chemically reactive species to be formed. In the preferred embodiment, the gas pressure in the second chamber 38 is maintained below 10 mTorr so that an accurate anisotropic etch is made. Additionally, the gas pressure in the first chamber 34 is preferably maintained between 200 and 400 mTorr.

Furthermore, a pump 72 connected to chamber 38 can help create the desired pressure differential between chamber 34 and chamber 38. This pump 72 can include a turbomolecular pump like that described in S. Wolf and R.N. Tauber, *Silicon Processing For The VLSI Era, Vol. 1: Process Technology*, Lattice Press (1986), on pages 95-97. Turbomolecular pumps are available from the Japanese companies Seko Seki, Osaka, and Shimazu. A regulating valve 71 is attached to the pump 72. Additionally, a pump 73 and regulator valve 75 may be connected to chamber 34 to help maintain the pressure differential between the chambers.

The passage 70 can be an orifice like that shown in FIG. 2 or the passage could be a tube 80 like that shown in FIG. 3. FIG. 3 is a partial schematic diagram of an alternative embodiment of the dry etcher of the present invention showing a tube 80 between the first chamber 34' and second chamber 38'. Optionally, a throttle valve 81 can be placed in the tube 80 to help regulate the pressure differential between the chambers.

Also shown in FIG. 3 is a baffle 82. The baffle 82 is used to remove ions from the gases in the first chamber 34'. The baffle 82 is preferably made of hardened aluminum and connected to a negative DC potential producing circuitry 74' for putting a negative DC potential on the baffle 82 so as to attract ions. The baffle 82 should be conductive. Alternately, the baffle could be a surface with a hole in it such as the baffle 76 shown in FIG. 2. In the dry etcher 30 of the present invention, most of the ions in the first chamber 34 are attracted to the baffle or recombine to form neutral gases or neutral chemically reactive species.

With the dry etcher 30 of the present invention, a large amount of chemically reactive species can be formed in the first chamber 34 which can then be used in the etching of a wafer 64 in the second chamber 38. The etching of the wafer 64 in the second chamber 38 can be isotropic in which case no power is provided by the second AC power generator 56. If no power is provided by the second AC generator 56, no ions are formed and no DC bias is formed on the electrode 60. Alternately, in an anisotropic etch, low energy ions are formed in the plasma discharge between electrodes 60 and 62 and are attracted to the DC bias on the electrode 60. This anisotropic etch is aided by the chemically reactive species formed in the first chamber 34.

Various details of the implementation and method are merely illustrative of the invention. It will be understood that various changes and such details may be within the scope of the invention, which used to be limited only by the appended claims.

What is claimed is:

1. An etching device for etching a wafer comprising:
A first container defining a first chamber, said first container including a means for supplying gases, and a first AC power means for supplying an AC signal to the gases to form chemically reactive species;
A second container defining a second chamber, said first and second containers defining a passage connecting said first and second chambers, said passage adapted to transfer some of the chemically reactive species from the first chamber to the second chamber and said passage further adapted to maintain different gas pressures in the first and second chamber, said second container including a second AC power means for forming ions and for setting a variable DC offset on the wafer.

2. The etching device of claim 1, further comprising means for maintaining the gas pressure in the second chamber at or below 10 mTorr.

3. The etching device of claim 2, wherein said second chamber gas pressure maintaining means comprises a turbomolecular pump.

4. The etching device of claim 2, wherein said passage is such that when the gas pressure in the second chamber is below 10 mTorr the gas pressure in the first chamber can be maintained in the range of 200 to 400 mTorr.

5. The etching device of claim 4, wherein said passage is in the range ¼" to 1" in diameter.

6. The etching device of claim 1, wherein the second AC power means includes a variable AC signal generator connected to a pair of electrodes and a blocking capacitor connected between the AC signal generator and one of the pair of electrodes, wherein said wafer is placed on said one of the pair of electrodes.

7. The etching device of claim 6, wherein the variable AC signal generator is such that it can send a 500 watt or less signal to the electrodes.

8. The etching device of claim 7, wherein the variable AC signal generator is such that it can send a 100 watt or less signal to the electrodes.

9. The etching device of claim 6, further comprising a matching network connected to the variable AC signal generator.

10. The etching device of claim 1, wherein the first AC power means comprises a variable AC signal generator connected to a pair of electrodes.

11. The etching device of claim 1, wherein the second AC power means is such that it can be adjusted to set no DC offset on the wafer and to not form ions in a manner that the wafer is isotopically etched by the chemically reactive species.

12. The etching device of claim 1, wherein the second AC power means is such that it can be adjusted to set a DC offset on the wafer to attract the ions in a manner that the wafer is anisotropically etched.

13. An etching device for etching a wafer comprising:
A first container defining a first chamber, said first container including a means for supplying gases, and a first AC power means for supplying an AC signal to the gases to form chemically reactive species and to form ions, wherein the first chamber further comprises a baffle for reducing the amount of ions that are transferred into the second chamber; and
A second container defining a second chamber, said second chamber being connected to the first chamber, the second chamber including a second AC power means for forming ions and for setting a variable DC offset on the wafer.

14. The etching device of claim 13, wherein said baffle is made of hardened aluminum wherein said device further comprises a means for placing a negative electrical potential on said baffle.

15. A method of etching a wafer in an etching device including a first container defining a first chamber and a second container defining a second chamber, the method comprising:
introducing gases into the first chamber;
forming chemically reactive species in the first chamber from the gases using a plasma discharge;

transferring gas including some of the chemically reactive species from the first chamber to the second chamber;

maintaining different gas pressures in the first and second chambers including the step of keeping the pressure in the first chamber in the range of 200 to 400 mTorr; and etching the wafer in the second container with the transferred gas.

16. The method of claim 15, wherein said maintaining step comprises the step of keeping the pressure in the second chamber below 10 mTorr.

17. A method of etching a wafer in an etching device including a first container defining a first chamber and a second container defining a second chamber, the method comprising:

introducing gases into the first chamber;

forming chemically reactive species in the first chamber from the gases using a plasma discharge;

transferring gas including some of the chemically reactive species from the first chamber to the second chamber;

maintaining different gas pressures in the first and second chambers;

forming ions in the second chamber; and etching the wafer in the second container with the transferred gas by supplying a DC offset on to the wafer so that the ions are attracted to the wafer and the wafer is etched anisotropically.

18. The method of claim 17, wherein said ion forming step comprises supplying an AC signal of less than 100 watts in the second chamber.

19. The method of claim 15, wherein the wafer etching step comprises isotropicly etching the wafer with the chemically reactive species in the transferred gas.

20. A method of etching a wafer in an etching device including a first container defining a first chamber and a second container defining a second chamber, the method comprising:

introducing gases into the first chamber;

forming chemically reactive species and ions in the first chamber from the gases using a plasma discharge;

removing some of the ions from the gases by electrically attracting the ions to a baffle;

thereafter, transferring the gases including some of the chemically reactive species from the first chamber to the second chamber;

maintaining different gas pressures in the first and second chambers; and etching the wafer in the second container with the transferred gas.

21. The method of claim 20, wherein the ion removing step comprises putting a positive electrical potential on said baffle.

* * * * *